United States Patent
Xie et al.

(10) Patent No.: US 10,825,579 B2
(45) Date of Patent: Nov. 3, 2020

(54) SHIELDING LAYER AND A CABLE PROVIDES WITH THE SHIELDING LAYER

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Han-Run Xie, Huaian (CN); A-Nan Yang, Huaian (CN); Lu-Yu Chang, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/361,173

(22) Filed: Mar. 21, 2019

(65) Prior Publication Data

US 2019/0295742 A1  Sep. 26, 2019

(30) Foreign Application Priority Data

Mar. 22, 2018  (CN) .......................... 2018 1 0237352

(51) Int. Cl.
| | | |
|---|---|---|
| *H01B 7/18* | (2006.01) | |
| *H01B 7/22* | (2006.01) | |
| *H05K 9/00* | (2006.01) | |
| *H01B 7/04* | (2006.01) | |
| *H01B 7/00* | (2006.01) | |
| *H01B 7/17* | (2006.01) | |
| *H01B 9/02* | (2006.01) | |

(Continued)

(52) U.S. Cl.
CPC .......... *H01B 7/1875* (2013.01); *H01B 7/183* (2013.01); *H01B 7/22* (2013.01); *H05K 9/0098* (2013.01); *H01B 7/0045* (2013.01); *H01B 7/04* (2013.01); *H01B 7/17* (2013.01); *H01B 7/18* (2013.01); *H01B 7/1865* (2013.01); *H01B 7/225* (2013.01); *H01B 7/226* (2013.01); *H01B 7/228* (2013.01); *H01B 9/02* (2013.01); *H01B 9/024* (2013.01); *H01B 11/06* (2013.01); *H01B 11/08* (2013.01); *H01B 11/10* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,641,110 A | * | 2/1987 | Smith | ............... H01B 11/10 174/36 |
| 8,893,603 B2 | | 11/2014 | Weber et al. | |

(Continued)

FOREIGN PATENT DOCUMENTS

| | | | | | |
|---|---|---|---|---|---|
| JP | 2006164830 A | * | 6/2006 | ............... | H01B 7/17 |
| JP | 2012195304 A | * | 10/2012 | ............... | H01B 7/17 |
| WO | WO-2018116807 A1 | * | 6/2018 | ............... | H01B 7/00 |

*Primary Examiner* — Paresh H Paghadal
(74) *Attorney, Agent, or Firm* — Wei Te Chung; Ming Chieh Chang

(57) ABSTRACT

A cable includes a plurality of wires, an wrapping tape covering the outside of the wires, a shielding layer coated on the outside of the wrapping tape and an insulating cover coated on the outside of the shielding layer, the shielding layer includes a plurality of conductors, wherein the shielding layer includes fibers mixed with the conductors.

2 Claims, 4 Drawing Sheets

(51) Int. Cl.
*H01B 11/06* (2006.01)
*H01B 11/10* (2006.01)
*H01B 11/08* (2006.01)

(56) References Cited

U.S. PATENT DOCUMENTS

| | | |
|---|---|---|
| 9,570,213 B2 | 2/2017 | Liang et al. |
| 2005/0029006 A1* | 2/2005 | Takahashi ............ H01B 11/005 174/102 R |
| 2007/0068697 A1* | 3/2007 | Orfin ...................... H01B 7/065 174/113 R |
| 2010/0238088 A1* | 9/2010 | Mukai ...................... H01Q 9/30 343/859 |
| 2011/0209893 A1* | 9/2011 | Yu .......................... H01B 7/228 174/107 |
| 2015/0083482 A1* | 3/2015 | Eshima .................. H01B 7/182 174/393 |
| 2017/0231125 A1* | 8/2017 | Urashita ............. H01B 7/0216 |

* cited by examiner

SHIELDING LAYER AND A CABLE PROVIDES WITH THE SHIELDING LAYER

BACKGROUND OF THE INVENTION

1. Field of the Invention

The present invention relates generally to a shielding layer and a cable provides with the shielding layer, and more particularly to a flexible shielding layer and a cable provided with the shielding layer.

2. Description of Related Arts

U.S. Pat. No. 9,570,213, issued on Feb. 14, 2017, discloses a cable which includes a plurality of wires, a shielding layer surrounding the wires, and an insulating core covered with the shielding layer. The shielding layer is made of a metal material which is not flexible enough, making it difficult to properly route the cable.

U.S. Pat. No. 8,893,603, issued on Nov. 25, 2014, discloses a cable which contains wires for carrying power and data signals and an optional strengthening cord. Electromagnetic shielding (e.g., a metal braid, interwoven metal, and/or wrapped metal foil), a plastic sheath, and other layers may be used to cover the wires and strengthening cord. To provide the cable with an attractive and durable outer layer, the cable may be covered with intertwined fibers. The outer layer may have a tubular shape and may sometimes be referred to as an intertwined fiber cable cover or tubular intertwined fiber cable cover.

An improved cable is desired.

SUMMARY OF THE INVENTION

An object of the present invention is to provide a flexible shielding layer.

To achieve the above-mentioned object, a shielding layer includes a plurality of conductors and fibers mixed with the conductors.

Compared to the prior art, the present invention blends fibers in the conductor to enhance the bendability of the shielding layer.

An object of the present invention is to provide a flexible cable.

To achieve the above-mentioned object, a cable includes a plurality of wires, an wrapping tape covering the outside of the wires, a shielding layer coated on the outside of the wrapping tape, and an insulating cover coated on the outside of the shielding layer, the shielding layer including a plurality of conductors and fibers mixed with the conductors.

Compared to the prior art, the present invention blends fibers in the conductors to enhance the bendability of the cable.

DETAILED DESCRIPTION OF THE PREFERRED EMBODIMENT

Figure 1:
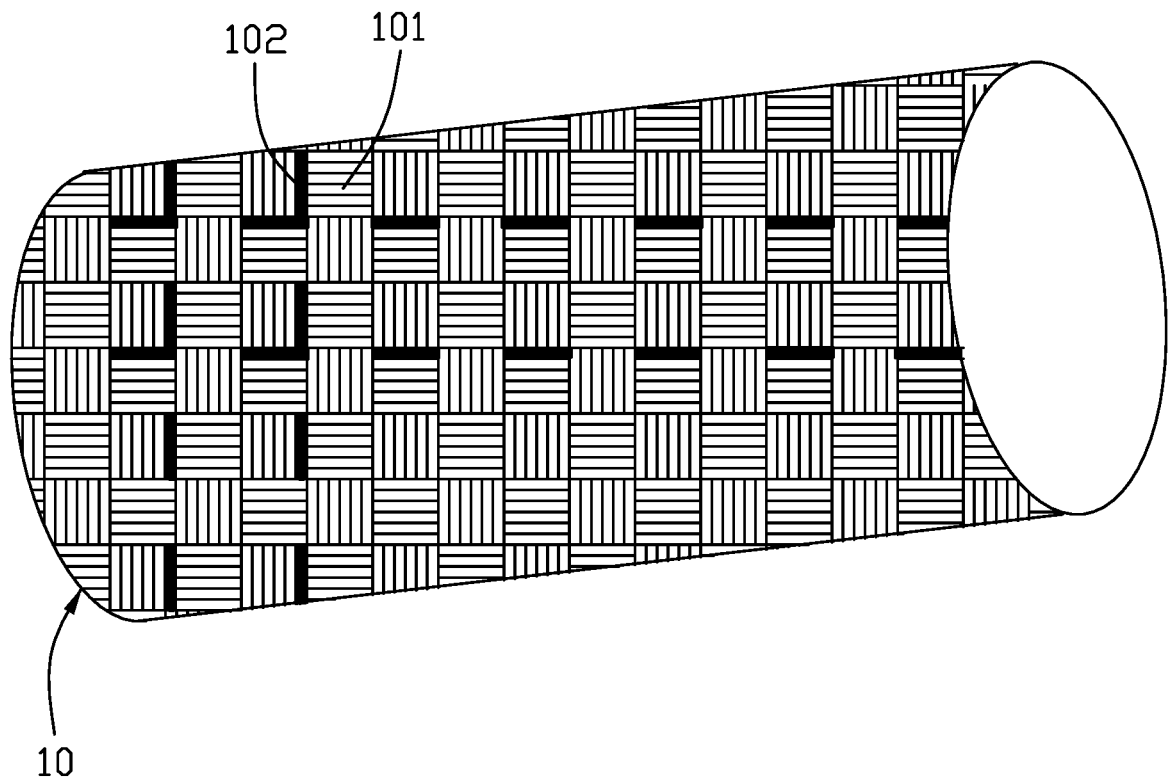
FIG. 1 is a perspective view of a shielding layer in accordance with a first embodiment of the present invention.

Referring to FIG. 1, a shielding layer 10 according to the first embodiment of the present invention includes a plurality of conductors 101 and fibers 102 mixed with the conductors 101. The shielding layer 10 defines a first direction and a second direction perpendicular to the first direction. The conductors 101 with the mixed fibers 102 are interwoven with each other in a first direction and a second direction to form the shielding layer 10.

Figure 2:
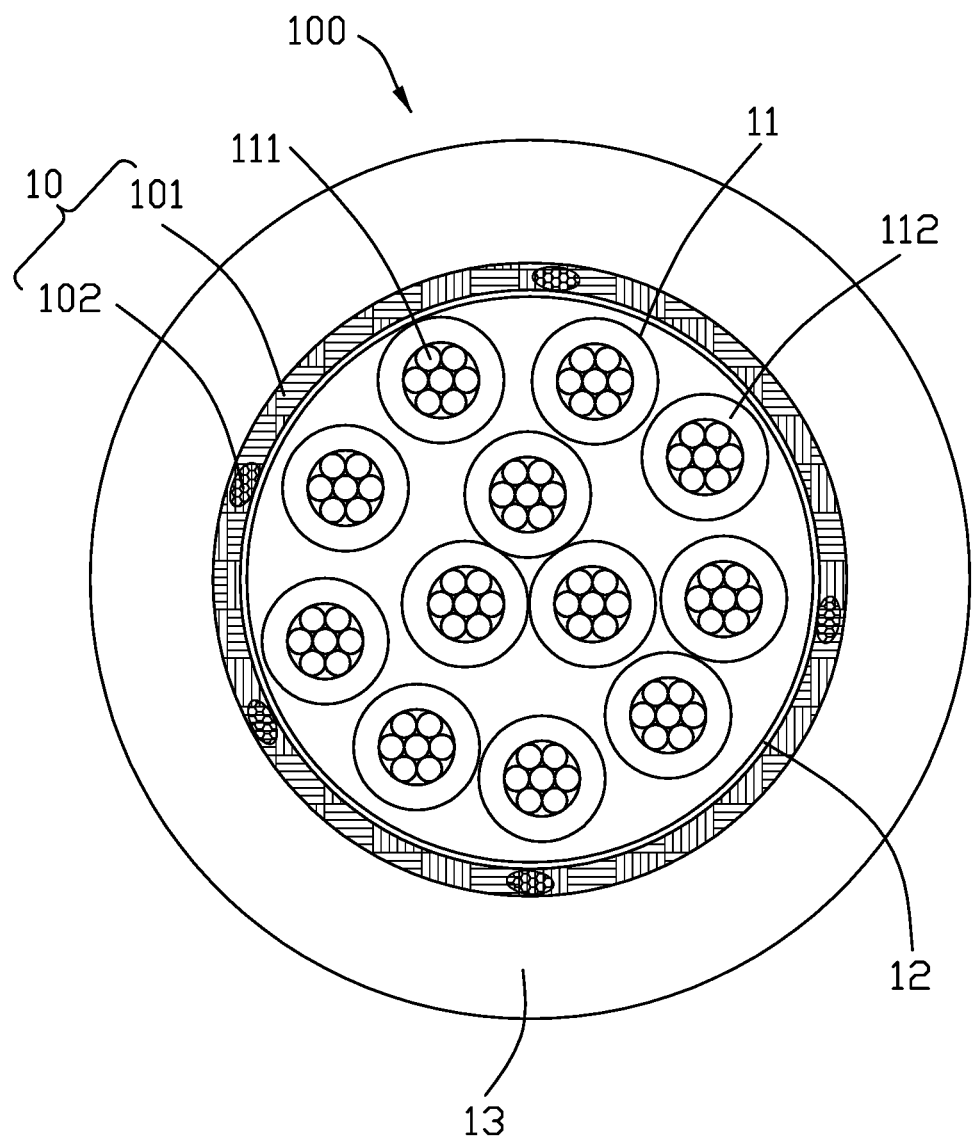
FIG. 2 is a cross-sectional view of the shielding layer of a cable as shown in FIG. 1.

Referring to FIG. 2, a cable 100 provided with the shielding layer 10. The cable 100 is a USB 2.0 or USB 3.0 cable. The cable 100 includes a plurality of wires 11, a wrapping tape 12, with or without adhesives thereon, covering the outside of the wires 11, the shielding layer 10 coated on the outside of the wrapping tape 12 and an insulating cover or outer jacket 13 coated on the outside of the shielding layer 10. The wires 21 include a plurality of cores 111 and an inner insulating layer 112 coated on the outside of the cores 111. The wires 111 can be power wires, ground wires or data transmission wires. The wrapping tape 12 is a hybrid aluminum foil Mylar layer. The wrapping tape 12 also can be an AL (Aluminum Foil) or a PET (Polyethylene terephthalate) material. The shielding layer 10 includes a plurality of conductors 101 and fibers or filler units 102 mixed with the conductors 101 to enhance the bendability of the cable 100. The shielding layer 10 defines a first direction and a second direction perpendicular to the first direction. The conductors 101 mixed fibers 102 are interwoven with each other in a first direction and a second direction to form the shielding layer 10. The conductors 101 are copper wires or an aluminum-magnesium alloy, and the fibers 102 are Kevlar or nylon.

Figure 3:
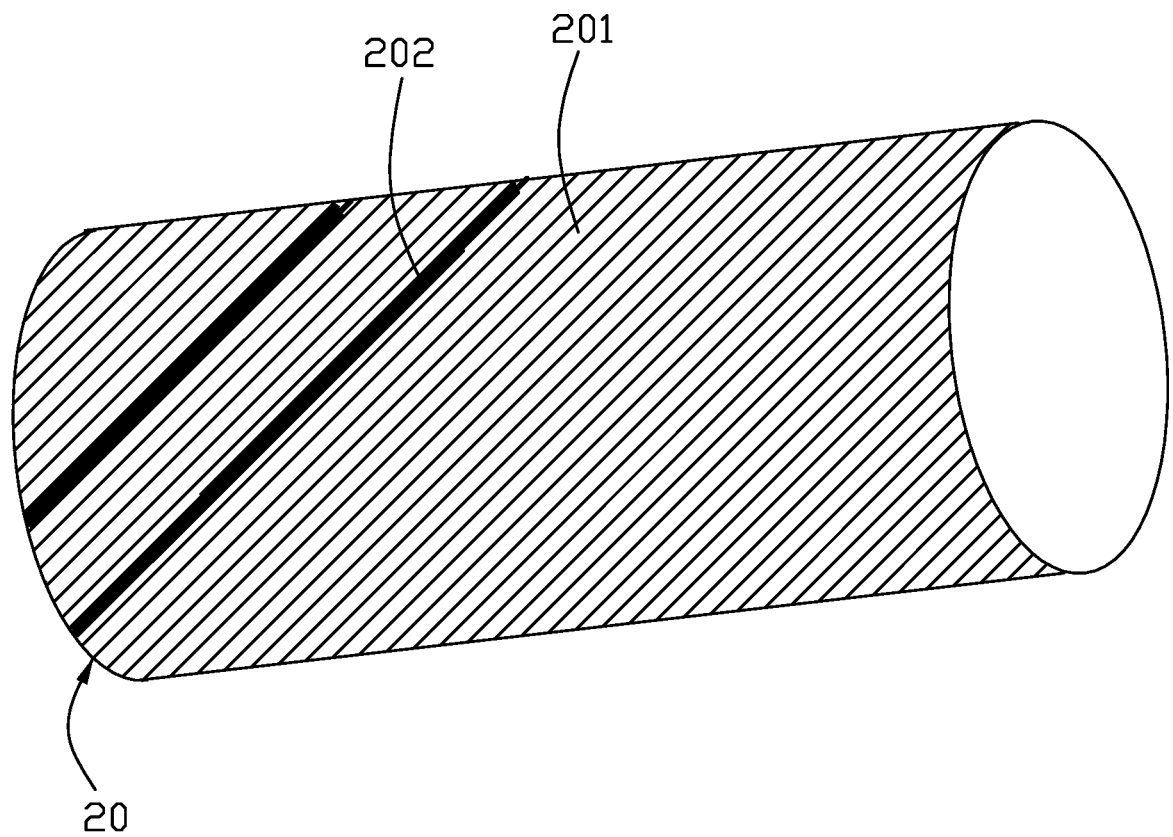
FIG. 3 is a perspective view of a shielding layer in accordance with a second embodiment of the present invention.

Referring to FIG. 3, a shielding layer 20 according to the second embodiment of the present invention includes a plurality of conductors 201 and fibers 202 mixed with the conductors 201. The conductors 201 are mixed with the fibers 202 in the axial direction of the center position of the shielding layer 20.

Figure 4:
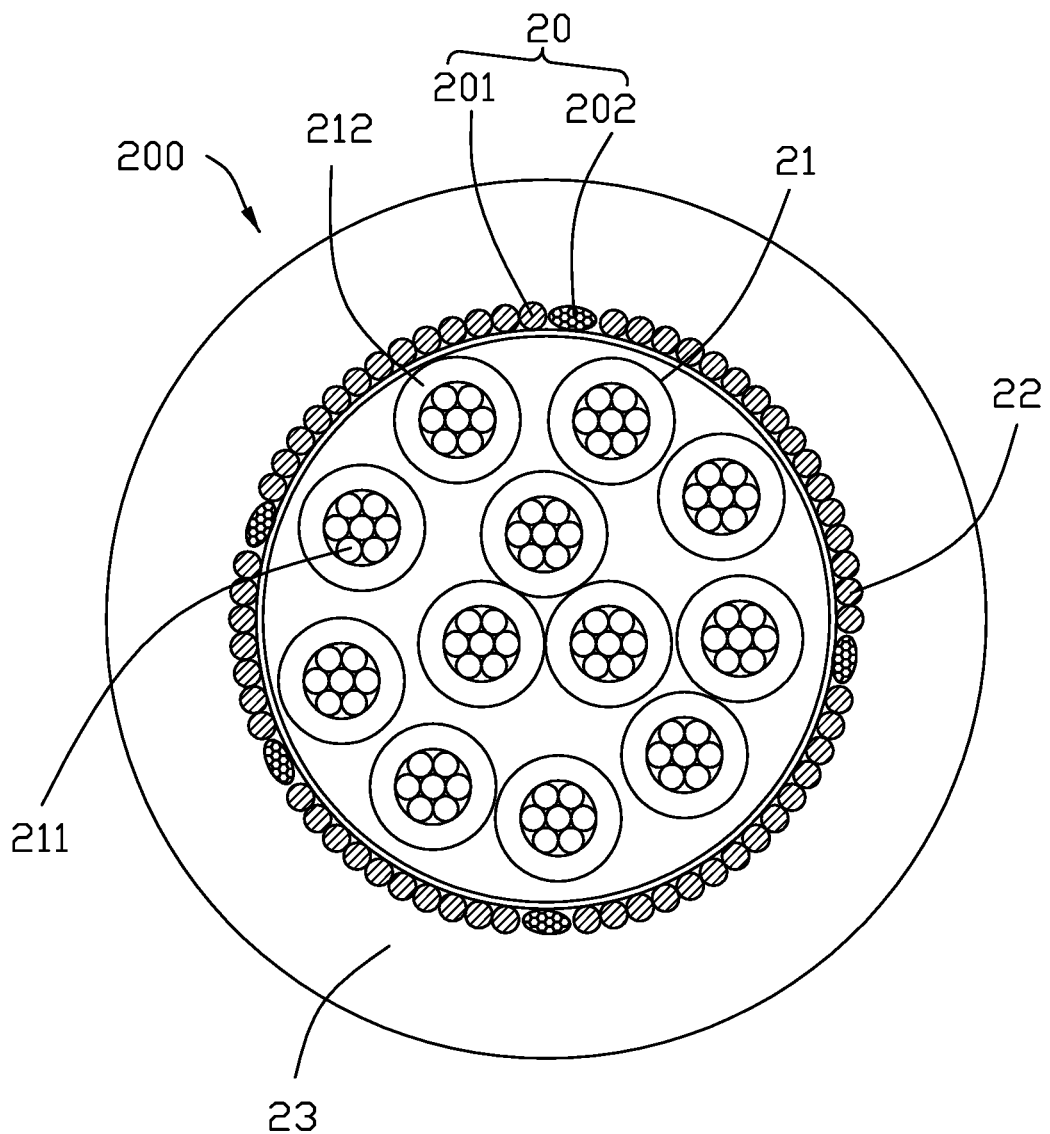
FIG. 4 is a cross-sectional view of the shielding layer of a cable as shown in FIG. 3.

Referring to FIG. 4, a cable 200 provided with the shielding layer 20. The cable 200 is a USB 2.0 or USB 3.0 cable. The cable 200 includes a plurality of wires 21, an wrapping tape 22 covering the outside of the wires 21, the shielding layer 120 coated on the outside of the wrapping tape 22 and an insulating cover 23 coated on the outside of the shielding layer 20. The wires 21 include a plurality of cores 211 and an inner insulating layer 212 coated on the outside of the cores 211. The wires 211 can be power wires, ground wires or data transmission wires. The wrapping tape 22 is a hybrid aluminum foil Mylar layer. The wrapping tape 22 also can be an AL (Aluminum Foil) or a PET (Polyethylene terephthalate) material. The shielding layer 20 includes a plurality of conductors 201 and fibers 202 mixed with the conductors 201 to enhance the bendability of the cable 200. The conductors 201 are mixed with the fibers 202 in the axial direction of the center position of the shielding layer 20. The conductors 101 are copper wires or an aluminum-magnesium alloy, and the fibers 102 are Kevlar or nylon.

What is claimed is:

1. A cable comprising:
   a plurality of wires essentially evenly arranged within a circular region in a cross-sectional view, each of said wires having a core enclosed within an inner insulative layer;

a shielding layer essentially composed of a plurality of metal wires interwoven together; and an insulative outer jacket covering the shielding layer; wherein a plurality of insulative filler unit are intermixed within said shielding layer for enhancing bendability of the cable; wherein the metal wires and the insulative filler units are intimately and densely interwoven together so as to form complete circumferential shielding structurally; and a cross-sectional dimension of each of said insulative filler units is larger than that of the signal metal wire;

wherein all of the metal wires are evenly grouped in a plurality of groups except the insulative filler units are arranged to replace the some of the metal wires of few selected groups of the plurality of groups, and each of the few selected groups has only one insulative filler unit of the insulative filler units.

2. A cable comprising:

a plurality of wires essentially evenly arranged within a circular region in a cross-sectional view, each of said wires having a core enclosed within an insulative layer;

a shielding layer essentially composed of a plurality of metal wires densely arranged together; and an insulative outer jacket covering the shielding layer; wherein a plurality of insulative filler units are intermixed within said shielding layer for enhancing bendability of the cable; wherein the metal wires and the insulative filler units are intimately and densely interwoven together so as to form complete circumferential shielding structurally; and a cross-sectional dimension of each of said insulative filler units is larger than that of the single metal wire;

wherein all of the metal wires are evenly grouped in a plurality of groups except the insulative filler units are arranged to replace the some of the metal wires of few selected groups of the plurality of groups, and each of the few selected groups has only one insulative filler unit of the insulative filler units.

* * * * *